United States Patent [19]
Peng

[11] Patent Number: 6,133,863
[45] Date of Patent: Oct. 17, 2000

[54] MULTIPLE REFERENCE VOLTAGES GENERATOR

[75] Inventor: Yung-Chow Peng, Hsinchu, Taiwan

[73] Assignee: Winbond Electronics Corp., Taiwan

[21] Appl. No.: 09/182,752

[22] Filed: Oct. 29, 1998

[30] Foreign Application Priority Data

Mar. 10, 1998 [TW] Taiwan ................................. 87103437

[51] Int. Cl.$^7$ ...................................................... H03M 1/10
[52] U.S. Cl. ........................... 341/120; 341/154; 341/158
[58] Field of Search ..................................... 341/120, 154, 341/158

[56] References Cited

U.S. PATENT DOCUMENTS

| | | | |
|---|---|---|---|
| 4,578,668 | 3/1986 | Sugimoto | 340/347 DA |
| 4,804,941 | 2/1989 | Yoshii | 341/140 |
| 5,153,592 | 10/1992 | Fairchild et al. | 341/118 |
| 5,471,208 | 11/1995 | Sauer . | |
| 5,666,118 | 9/1997 | Gerbasch | 341/120 |

OTHER PUBLICATIONS

"Trimless High Precision Ratioed Resistors in D/A and A/D Converters," R. Wittman et al., *IEEE Journal of Solid–State Circuits*, vol. 30, No. 8, Aug. 1995, pp. 935–939.

*Primary Examiner*—Howard L. Williams
*Attorney, Agent, or Firm*—Majestic, Parsons, Siebert & Hsue P.C.

[57] ABSTRACT

A multiple reference voltages generation apparatus, which generates multiple reference voltages to an analog-to-digital converter (ADC), is provided. The apparatus includes a resistor-string and a control device. The resistor-string has a first terminal and a second terminal for connecting respectively with a first reference voltage and a second reference voltage. The resistor-string comprises a plurality of series-connected resistors which define a plurality of nodes for outputting the multiple reference voltages. A plurality of Bit-Decision-Node $\{n<2^k \times j>$, where k=0, ... (m−1), j is an odd positive integer and $(2^k \times j)$ is smaller than $2^m\}$ determine accuracy of a corresponding output bit $a_k$ of the ADC. A corresponding reference voltage $Vn<_2^k \times j>$ is output at each Bit-Decision-Node. The control device adjusts the voltage $V_{n<2^k \times j>}$ on Bit-Decision-Node $n<2^k \times j>$ to make $V_{n<2^k \times j+BW(a_k)>} - V_{n<2^k \times j>}$ approximately equal to $V_{n<2^k \times j>} - V_{n<2^k \times j - BW(a_k)>}$, wherein $BW(a_k)$ is the weight value of the bit $a_k$.

26 Claims, 12 Drawing Sheets

MULTIPLE REFERENCE VOLTAGES GENERATOR

FIELD OF THE INVENTION

The present invention relates to a precision multiple reference voltages generator and, more particularly, to a calibration circuit for the multiple reference voltages generator.

BACKGROUND OF THE INVENTION

The resistor-string (or resistor-ladder), which is usually composed of a number of series-connected resistors of equal value, is commonly used as a multiple reference voltages generator in an analog-to-digital circuits (ADC) or a digital-to-analog circuits (DAC). The resistance of each resistor in the resistor-string will not be a design value exactly when the resistor-string are fabricated in a silicon substrate. In other words, one can only expect the resistance of each resistor in the resistor-string could be very closer to each other, and they could never be the same due to the inherent limitation of the manufacturing process.

In the article "Trimless High Precision Ratioed Resistors in D/A and A/D Converters", published on IEEE Solid State Circuits Vol. 30, No. 8, August 1995, Wittman, Schardein, Hosticka, and Burbach, an application of a resistor-string in ADC or DAC is disclosed. In this article, the factors influencing the resistance value of each resistor during the manufacturing process are analyzed and verified. The article also disclosed a ladder-type resistor arranged in an intermeshed configuration so as to enhance the precision of the resistance value of each resistor.

U.S. Pat. No. 5,471,208 disclosed a circuit which automatically adjusts a resistor-string. A MOS is connected in parallel with a corresponding resistor. The resistance value of the MOS is adjusted, according to the comparison result of the voltage drop across the corresponding resistor with a reference voltage. As a result, the equivalent resistance of the MOS in parallel with the corresponding resistor is equal to a desired resistance value. In this way, the voltage drop across the corresponding resistor could be equal to the reference voltage.

SUMMARY OF THE INVENTION

An alternative method and circuit are disclosed in the present invention for precisely adjusting the voltage drop across each resistor in a resistor-string such that a precision multiple reference voltages generator is resulted.

The apparatus of the invention includes a resistor-string and a control device. The resistor-string has a first terminal and a second terminal for connecting respectively with a first reference voltage and a second reference voltage. The resistor-string comprises a plurality of series-connected resistors which define a plurality of nodes for outputting the multiple reference voltages.

A plurality of Bit-Decision-Node $\{n<2^k \times j>$, where $k=0, \ldots (m-1)$, j is an odd positive integer and $(2^k \times j)$ is smaller than $2^m\}$ determine accuracy of a corresponding output bit $a_k$ of an ADC. A corresponding reference voltage $Vn<2^k \times j>$ is output at each Bit-Decision-Node. The control device adjusts the voltage $V_{n<2^k \times j>}$ on Bit-Decision-Node $n<2^k \times j>$ to make $V_{n<2^k \times j + BW(a_k)>} - V_{n<2^k \times j>}$ approximately equal to $V_{n<2^k \times j>} - V_{n<2^k \times j - BW(a_k)>}$, wherein $BW(a_k)$ is the weight value of the bit $a_k$.

DETAILED DESCRIPTION OF THE PRESENT INVENTION

Figure 1:
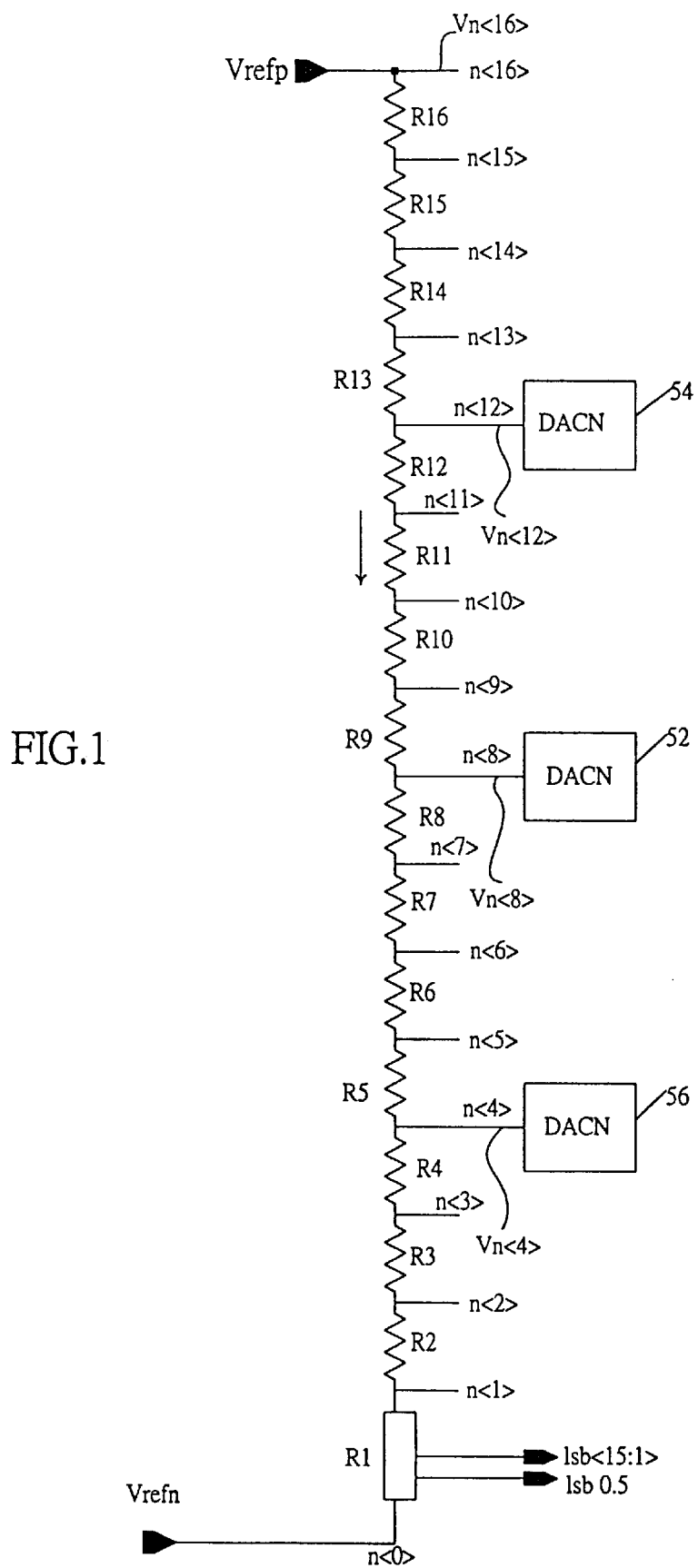
FIG. 1 discloses a multiple reference voltages generator which includes a resistor-string in which the voltage on node n<12> is adjusted by DACN 54, the voltage on node n<8> is adjusted by DACN 52 and the voltage on node n<4> is adjusted by DACN 56 in accordance with the example of the invention.

As shown in FIG. 1, the resistor-string of the multiple reference voltages generator of the invention includes a plurality of series-connected resistors. The design value of resistance of each resistor is r. The resistor-string generates 16 reference voltages $V_{n<1>}$ through $V_{n<16>}$ to a m-bit analog-to-digital converter (ADC) (not shown), wherein m=4. In the following context, n<8> denotes the eighth node and $V_{n<8>}$ denotes the voltage at n<8>, etc. The correspondent ADC generates a 4-bit digital signal $a_3 a_2 a_1 a_0$ according to the received reference voltages and an analog signal. The $a_3$ is the Most Significant Bit (MSB) and the $a_0$ is the Least Significant Bit (LSB). It is well known that to improve the precision of MSB, the reference voltage on node of the half way, i.e. ½, of resistor-string should be accurate. Furthermore, to improve the precision of $a_3 a_2$ the reference voltage on nodes of $(k/2^2)$ of resistor-string should be accurate, wherein k=1 to 3. To improve the precision of $a_3 a_2 a_1 a_0$, the reference voltage on the nodes of $(k/2^4)$ of resistor-string should be accurate, wherein k=1 to $(2^4-1)$.

Figure 2:
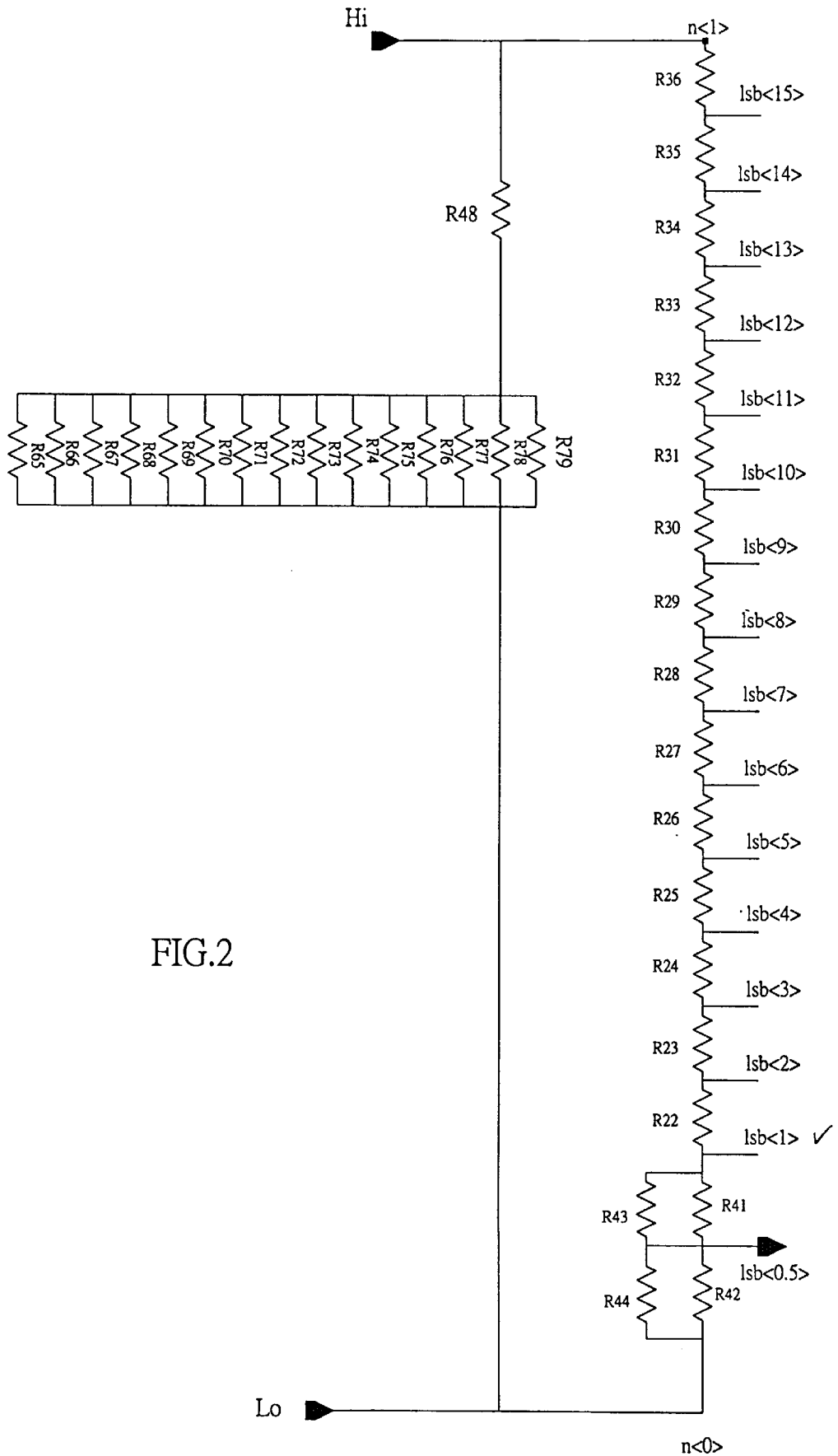
FIG. 2 discloses a voltage divider in R1 of FIG. 1.

The resistor block R1 of FIG. 1 includes a voltage divider shown in FIG. 2. The resistance value of each resistor in FIG. 2 is r. Sixteen reference voltages are generated on nodes lsb<0.5>, lsb<1>, lsb<2>, . . . lsb<15> respectively. Please note that the equivalent resistance between Hi and Lo in FIG. 2 is r.

To accomplish a A/D conversion with 8-bit resolution, the most straightforward way is to generate 256 reference voltages by a resistor-string composed of 256 resistors of the same resistance value. An alternative and improved way is to adopt the resistor-string FIG. 1 in cooperation with the voltage divider of FIG. 2. It is observed that, the digital output $a_7 a_6 a_5 a_4 a_3 a_2 a_1 a_0$ of the 8-bit A/D conversion is obtained by combining the 4-bit higher resolution digital signal $a_7 a_6 a_5 a_4$, generated by an ADC using the 16 reference voltages in FIG. 1 as input, with the 4-bit lower resolution digital signal $a_3a_2a_1a_0$, generated by another ADC using the 16 reference voltages in FIG. 2 as input. Through this improved way, only 32 resistors of equal value are needed for two stages ADC compared to the conventional approach using 256 resistors for flash ADC. In FIG. 2, a voltage $V_{lsb<0.5>}$ is generated by resistors R41, R42, R43, R44, and the details of utilization of $V_{lsb<0.5>}$ is described later. It is noted that the Hi in FIG. 2 equals to the reference voltage $V_{n<1>}$, and the Lo in FIG. 2 equals to the reference voltage $V_{n<0>}$, or Vrefn.

The definitions of Bit Weight (BW) and Bit-Decision-Node (BDN) are described hereinafter. Bit Weight (BW) is the weight value corresponding to one ADC digital output bit $a_k$. Or, Bit Weight (BW) is the weight value corresponding to one DAC digital input bit $a_k$. That is, $BW(a_k)=2^k$. Bit-Decision-Node (BDN) is the node the reference voltage at which determines accuracy of a digital output bit $a_k$ of one ADC. Except one case, number of BDN is more than one. For example, only the reference voltage on node n<8> determines the value of digital output bit $a_3$ of a four-bit ADC. The reference voltages of n<4>, n<12> determine the value of the digital output $a_2$ of a four-bit ADC. Therefore, $BDN(a_3)$ is node n<8>, and $BDN(a_2)$ are nodes {n<4>, n<12>}. Furthermore, the $BDN(a_1)$ are nodes {n<2>, n<6>, n<10>, n<14>}. The $BDN(a_0)$ are nodes {n<1>, n<3>, n<5>, n<7>, n<9>, n<11>, n<13>, n<15>}. It has been proved that, for a resistor-string comprising $2^m$ resistors, $BDN(a_{m-1})$ is $n<2^{m-1}>$, and $BDN(a_k)$ is $\{n<2^k \times j>,$ wherein $k=0, \ldots, (m-2)$, j is an odd positive integer and $(2_k \times j)$ is smaller than $2^m\}$. Or, In more general expression, $BDN(a_k)$ is $\{n<2^k \times j>,$ wherein $k=0, \ldots, (m-1)$, j is an odd positive integer and $(2^k \times j)$ is smaller than $2^m\}$.

In one embodiment of the present invention, the reference voltages $V_{n<_2^k \times j>}$ on Bit-Decision-Node $n<_2^k \times j>$ are calibrated to make the following relationship held: $V_{n<_2^k \times j+BW(a_k)>} - V_{n<_2^k \times j>} \approx V_{n<_2^k \times j>} - V_{n<_2^k \times j - BW(a_k)>}$. Bit Weight (BW) is the weight value corresponding to one ADC digital output bit $a_k$. The expression $V_{n<_2^k \times j>}$ represents the voltage at the BDN $n<2^k \times j>$. The expression $n<_2^k \times j + BW(a_k)>$ denotes a node higher than BDN $n<2^k \times j>$ by $BW(a_k)$ amount, and $V_{n<_2^k \times j + BW(a_k)>}$ denotes the voltage at this node. The expression $n<_2^k \times j - BW(a_k)>$ denotes a node lower than BDN $n<2^k \times j>$ by $BW(a_k)$ amount, and $V_{n<_2^k \times j - BW(a_k)>}$ denotes the voltage at this node.

In the following recitations, we use $a_3$, $a_2$ of a four-bit ADC to explain the method and feature of the invention. In the invention, the reference voltages corresponding to the BDNs of lower Bit, i.e. $a_2$ are adjusted first, then the reference voltages corresponding to the BDNs of higher Bit, i.e. $a_3$, are adjusted in subsequent order. Referring to FIG. 1, the reference voltage corresponding to BDN ($a_2$) are first adjusted, then the reference voltage corresponding to BDN ($a_3$) are then adjusted. In other words, n<4> (or n<12>) is adjusted first, then n<12> (or n<4>) is adjusted, and then n<8> is adjusted. In alternative, n<12> is adjusted first, then n<4> is adjusted, and then n<8> is adjusted. The calibration operation is accomplished by the current digital-to-analog converters (DAC) 52, 54, 56 changing the current running through the resistor-string composed of R16~R1. In the following, we take the calibration cycle of n<4>, n<12>, n<8> as an example. Then the complete calibration sequence is n<4>→n<12>→n<8>→n<4>→n<12>→n<8>→n<4>→n<12>→n<8>→n<4>→n<12>→n<8>→n<4>→n<12>→n<8>→n<4>→n<12>→n<8>→n<4>→n<12>→n<8>, . . . until the relationships $Vn_{<8>} - Vn_{<4>} \approx Vn_{<4>} - Vn_{<0>}$, $Vn_{<16>} - Vn_{<12>} \approx Vn_{<12>} - Vn_{<8>}$, $Vn_{<16>} - Vn_{<8>} \approx Vn_{<8>} - Vn_{<0>}$ are held at the same time. Or, alternatively, the relationship $Vn_{<8>} - Vn_{<4>} \approx Vn_{<4>} - Vn_{<0>}$ can be expressed as $(Vn_{<8>} - Vn_{<4>} + Vn_{<0>} - Vn_{<4>}) \approx 0$. Or, alternatively, the relationship $Vn_{<16>} - Vn_{<12>} \approx Vn_{<12>} - Vn_{<8>}$ can be expressed as $(Vn_{<16>} - Vn_{<12>} + Vn_{<8>} - Vn_{<12>}) \approx 0$. Or, alternatively, the relationship $Vn_{<16>} - Vn_{<8>} - Vn_{<8>} - Vn_{<0>}$ can be expressed as $(Vn_{<16>} - Vn_{<8>} + Vn_{<0>} - Vn_{<8>}) \approx 0$. During calibration of node n<4>, the resistor series of (R8, R7, R6, R5) constitute the upper resistors to the node n<4> and the resistor series of (R4, R3, R2, R1) constitute the lower resistors to the node n<4>. The upper and lower resistors corresponding to the calibrated node constitute the resistor pair of the calibrated node. For instance, (R8, R7, R6, R5) and (R4, R3, R2, R1) constitute the resistor pair of the calibrated node n<4>. Therefore, the upper node of the resistor pair is n<8>, the middle node of the resistor pair is n<4> and the lower node of the resistor pair is n<0>. During calibration of node n<12>, the resistor series of (R16, R15, R14, R13) constitute the upper resistors to the node n<12> and the resistor series of (R12, R11, R10, R9) constitute the lower resistors to the node n<12>. Therefore, the upper node of the resistor pair is n<16>, the middle node of the resistor pair is n<12> and the lower node of the resistor pair is n<8>. During calibration of node n<8>, the resistor series of (R16, R15, R14, R13, R12, R11, R10, R9) constitute the upper resistors to the node n<8> and the resistor series of (R8, R7, R6, R5, R4, R3, R2, R1) constitute the lower resistors to the node n<8>. Therefore, the upper node of the resistor pair is n<16>, the middle node of the resistor pair is n<8> and the lower node of the resistor pair is n<0>.

Figure 3:
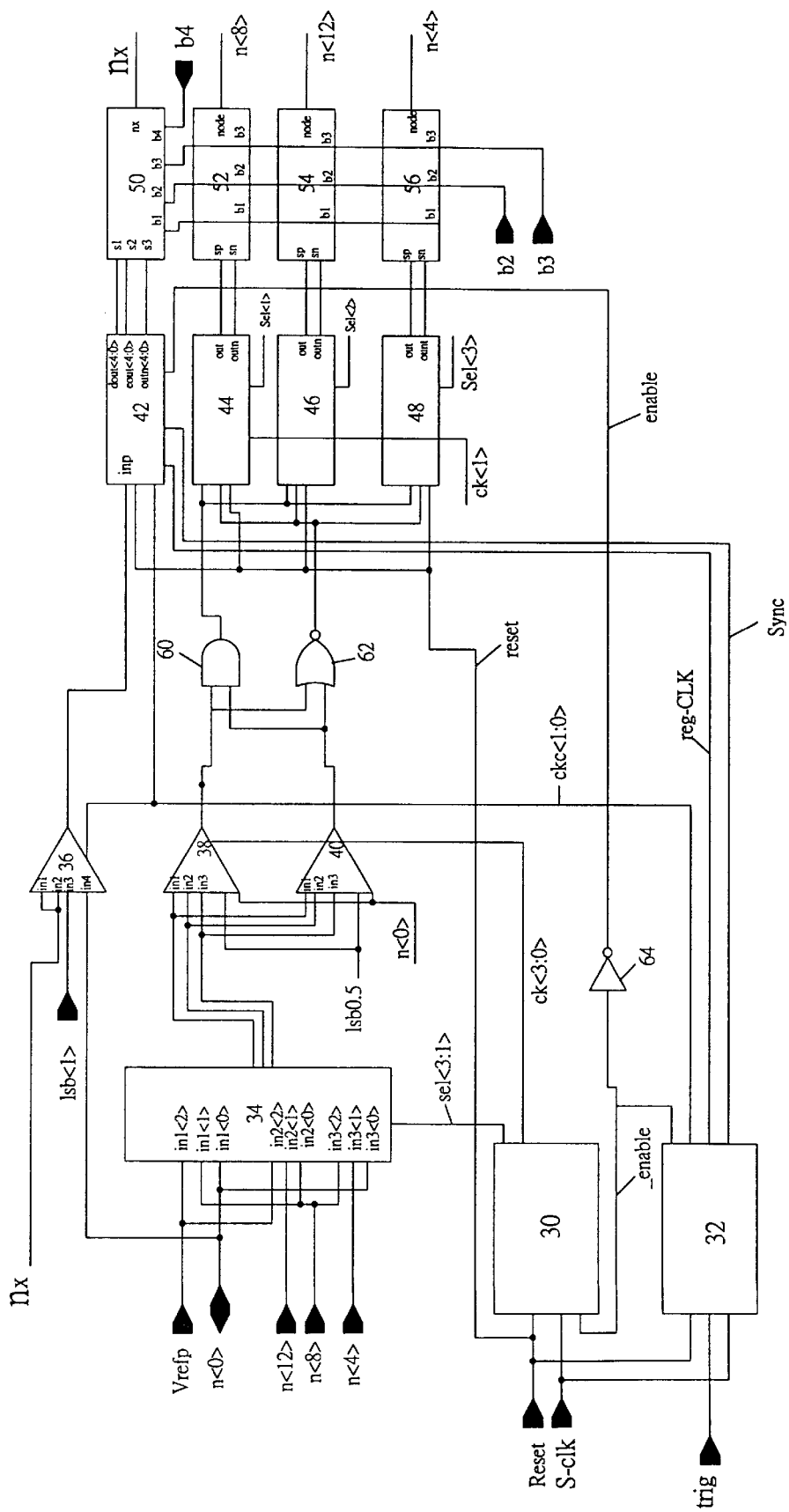
FIG. 3 discloses a calibration circuit of the present invention.
Figure 7:
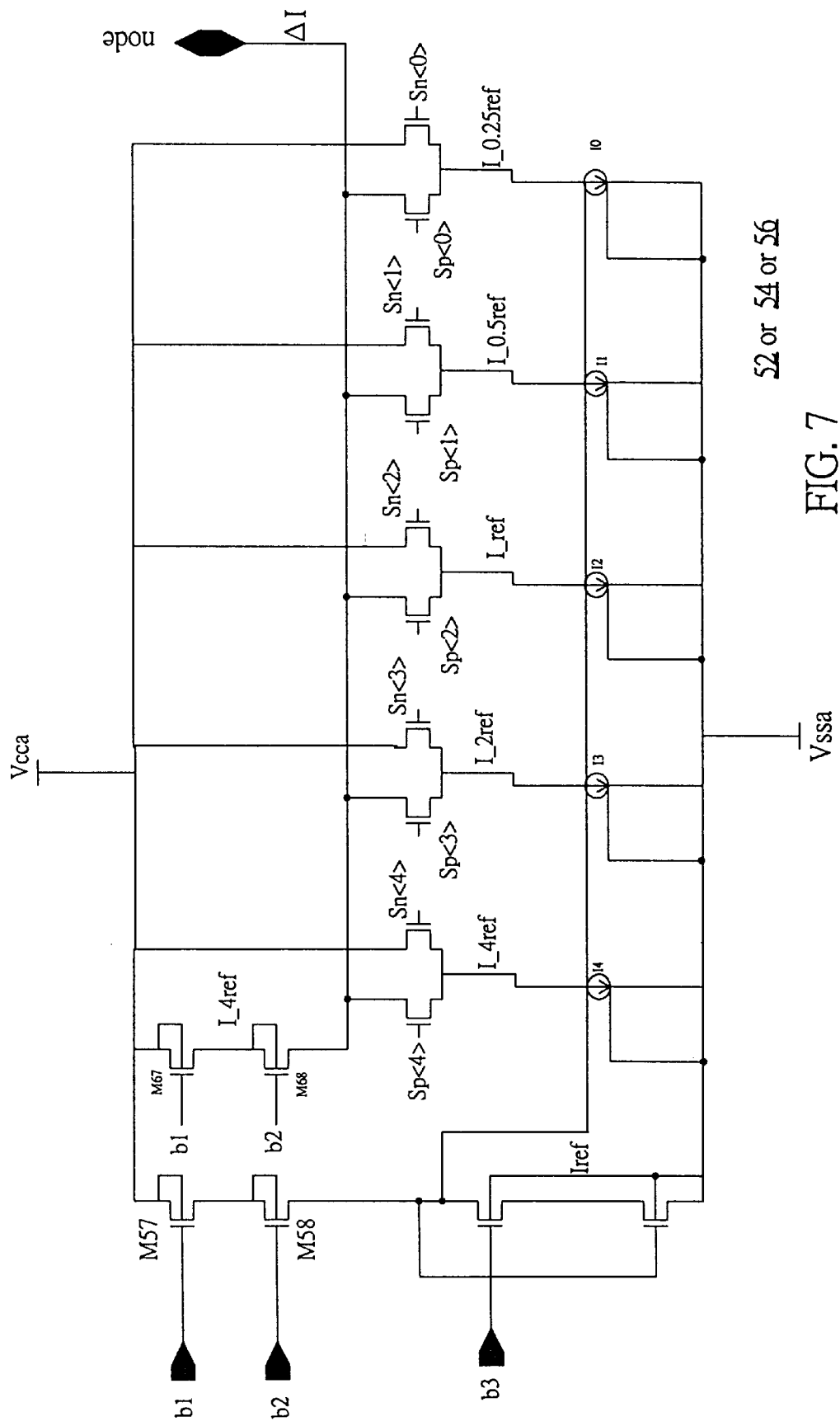
FIG. 7 discloses one embodiment of the current DACN 52, DACN 54, or DACN 56 in FIG. 3.

Referring to FIG. 3, the calibration circuit according to embodiment of the present invention includes a sequence control circuit 30, a successive approximate (SA) control circuit 32, a multiplexer 34, comparators 36, 38, 40, a successive approximation register 42, up/down counters 44, 46, 48, a current DACΦ 50, current DACNs 52, 54, 56. The SA control circuit 32, comparator 36, successive approximation register 42, and current DACΦ 50 constitute a function which generates a reference current according to the well known successive approximate algorithm which is well known in the art. The details of SA algorithm may be found in publications regarding digital-to-analog conversion or analog-to-digital conversion. The current DAC, which receives the digital signals and generates a corresponding analog current signals, is different from the voltage DAC. The SA control circuit 32, comparator 36, successive approximation register 42, and current DACΦ 50 are used to generate a reference current $I_{ref}$ for DACN 52, 54, 56, which will be clear when FIG. 7 is discussed.

The SA control circuit 32 receives a Reset signal, a system clock signal (S_clk), a trigger signal (trig) from the system (not shown), and generates a calibration enable signal (_enable), the clock signals (ckc<1:0>), a register clock signal (reg_clk), a synchronization signal (Sync) to other devices in the figure. The SA control circuit 32, the comparator 36, the successive approximation register 42, and the resistor-string in FIG. 6 together determine the reference current I(DACΦ) of the current DACΦ 50. The synchronization signal (Sync) from the SA control circuit 32 synchronizes the operation of register clock signal (reg_clk) which is used to seek a reference current. Furthermore, the SA control circuit 32 determines whether the calibration circuit is in Calibration Mode, in Reference Current Generation Mode or in normal operation Mode. When a power-on or trigger signal (trig) event is detected, the calibration enable signal (_enable) is disabled and the calibration circuit is in Reference Current Generation Mode. When the SA algorithm is executed and the reference current I(DACΦ) is generated, the calibration enable signal (_enable) is enabled. The timing sequence of clock signals (ckc<1:0>) is ckc<1>→ckc<0>. In the normal operation mode, the multiple reference voltages output by the invention are utilized by an ADC or a DAC to generate digital signal or analog signal.

Figure 10:
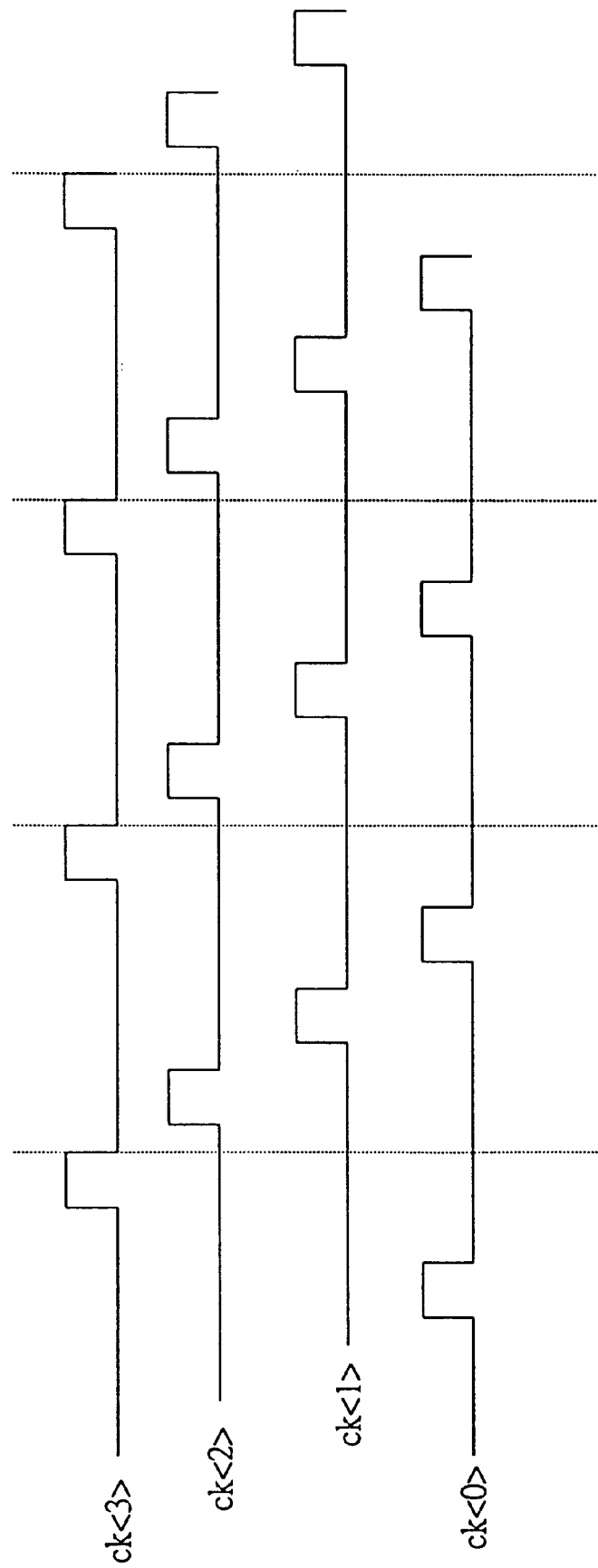
FIG. 10 discloses the timing sequence of ck<i>, i=0 to 3.

The sequence control circuit 30 receives the Reset signal, the system clock (S_clk), the calibration enable signal (_enable), and generates the selection signals (sel<3:1>), the non-overlapped clock signals (ck<3:0>) to determine the sequence for calibrating the nodes. The timing sequence of the clock signals (ck<3:0>) is ck<3>→ck<2>→ck<1>→ck<0>, as shown in FIG. 10.

The multiplexer 34 has three set of input terminals. The first set of input terminals receives $V_{refp}$, $V_{n<8>}$, $V_{n<0>}$, the second set of input terminal receives $V_{refp}$, $V_{n<12>}$, $V_{n<8>}$ and the third set of input terminal receives $V_{n<8>}$, $V_{n<4>}$, $V_{n<0>}$. As we adjust the nodes in the order of (n<4>→n<12>→n<8>) as recited previously, the selection signals Sel<3:1>first couples the third set of input terminal to the output terminals (out<2>, out<1>, out<0>), and then couples the second set of input terminal to the output terminals, and then couple the first set of input terminal to the output terminals. The calibration sequence n<4>→n<12>→n<8>→n<4>→n<12>→n<8>→n<4>→ n<12>→n<8>→n<4>→n<12>→n<8>→n<4>→n<2>→ n<8>→n<4>→n<12>→n<8>→n<4>→n<12>→n<8>→ n<4>→n<12>→n<8>, ... will continue until the relationships $Vn_{<8>}-Vn_{<4>} \approx Vn_{<4>}-Vn_{<0>}$, $Vn_{<16>}-Vn_{<12>} \approx Vn_{<12>}-Vn_{<8>}$, $Vn_{<16>}-Vn_{<8>} \approx Vn_{<8>}-Vn_{<0>}$ are held at the same time. When n<4>is adjusted, the signal sel<3>is enabled and the multiplexer 34 outputs $V_{n<8>}$, $V_{n<4>}$, and $V_{n<0>}$. In the meanwhile, the up/down counter 48 is activated by signal sel<3>, and the reference voltage at n<4> is adjusted. When n<12> is adjusted, the signal sel<2> is enabled and the multiplexer 34 outputs $V_{refp}$, $V_{n<12>}$, and $V_{n<8>}$. In the meanwhile, the up/down counter 46 is activated by signal sel<2>, and the reference voltage at n<12> is adjusted. When n<8> is adjusted, the signal sel<1> is enabled and the multiplexer 34 outputs Vrefp, $V_{n<8>}$, and $V_{n<0>}$. In the meanwhile, the up/down counter 44 is activated by signal sel<1>, and the reference voltage at n<8> is adjusted. The output value of AND gate 60 makes the up/down counters 44, 46 or 48 count downwards, and the output value of NOR gate 62 makes the up/down counters 44, 46 or 48 count upwards.

Figure 4:
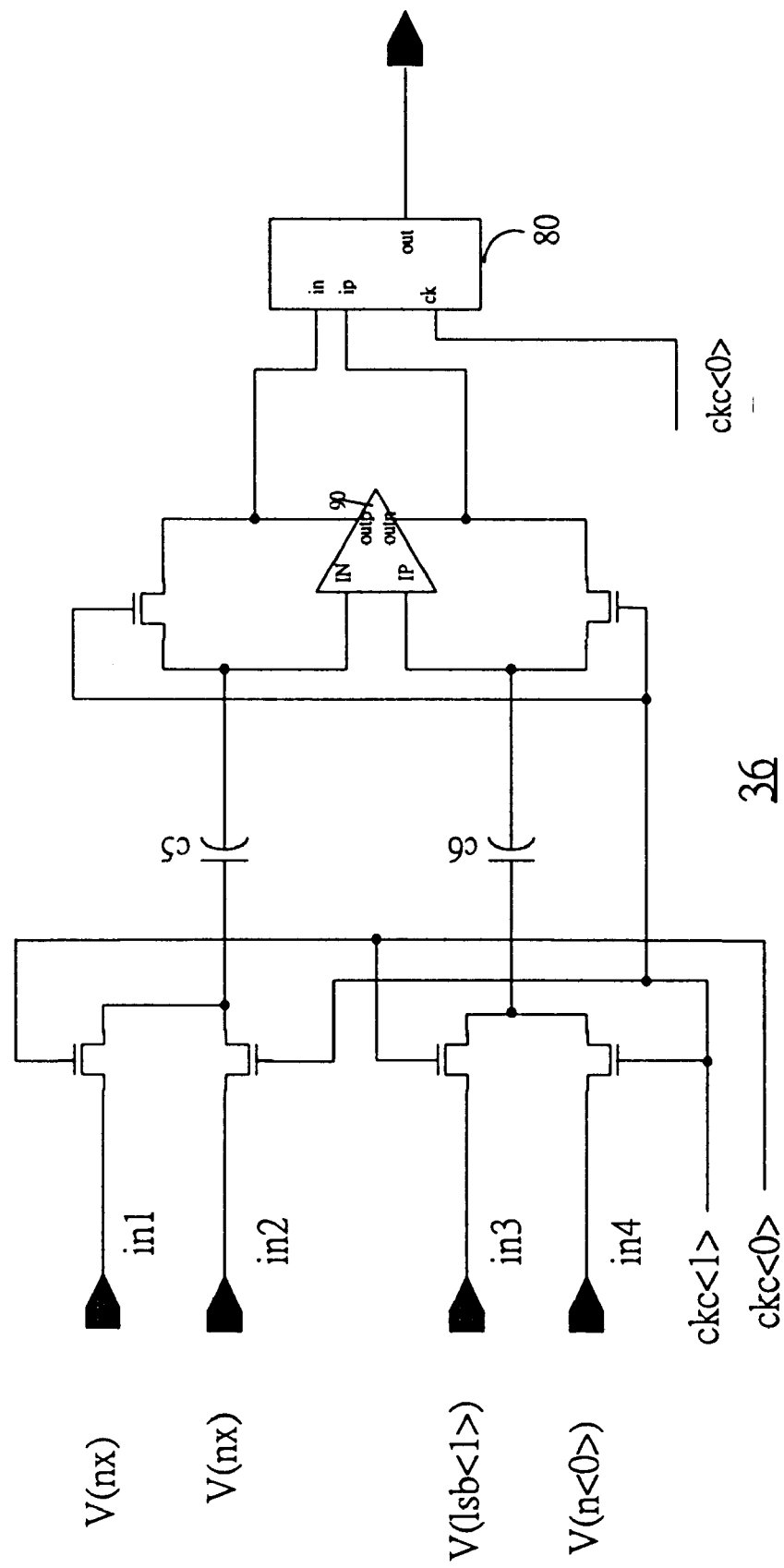
FIG. 4 discloses one embodiment of the comparator 36 in FIG. 3.
Figure 5:
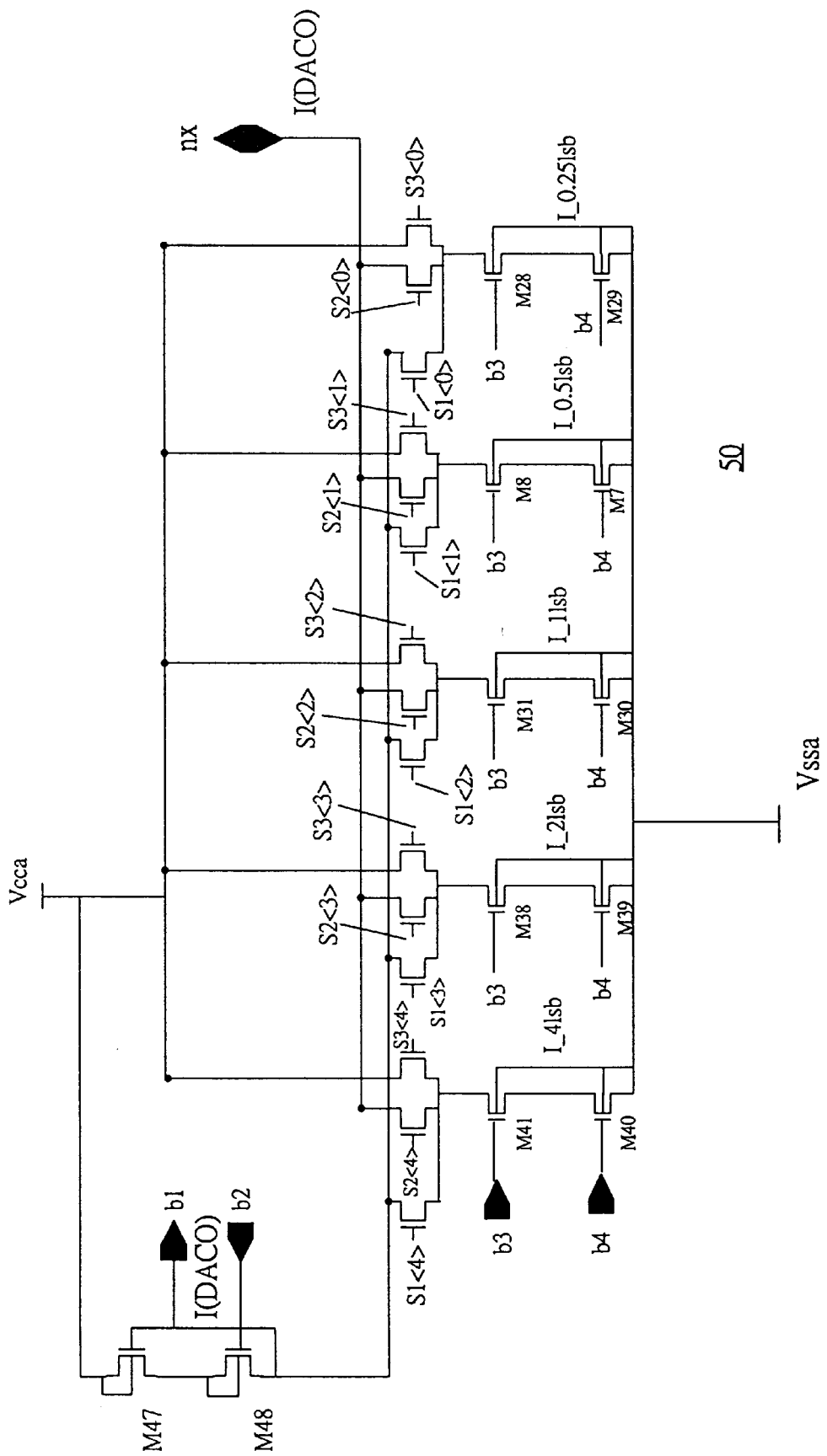
FIG. 5 discloses one embodiment of the current DACΦ 50 in FIG. 3.
Figure 6:
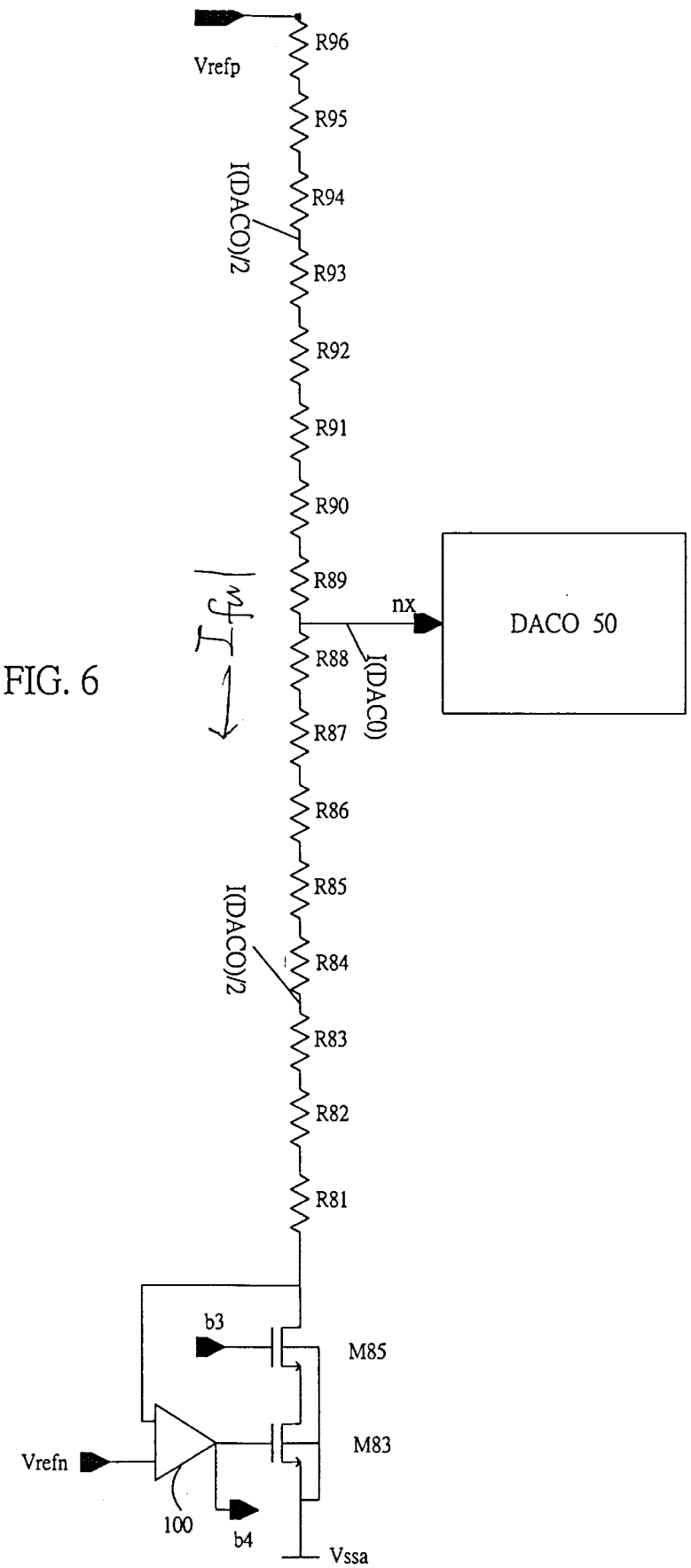
FIG. 6 discloses a reference current generator including a resistor-string in which the node nx is connected with DACΦ 50 for generating a reference current I(DACΦ).

Referring to FIG. 3, FIG. 4 and resistor-string in FIG. 6, the node nx connects to in1, in2 of the comparator 36, and connects to nx of the DACΦ 50. In FIG. 6, as the DACΦ 50 draws current of I Ampere via the node nx, the changed current from $V_{refp}$ is I/2 Ampere, and the other changed current from $V_{ssa}$ is (−I/2) Ampere. The corresponding changed voltage drop with respect to $V_{refp}$ or $V_{ssa}$ is (I/2)×8×r, wherein r is the resistance value of each resistor in FIG. 6. In general case, as the resistance value of the resistor-string is $2^m \times r$, the corresponding changed voltage drop between $V_{refp}$ and node nx would be $(I/2) \times (\frac{1}{2}) \times 2^m \times r$, or $[(I/4) \times 2^m \times r]$. Referring back to FIG. 3, when ckc<1> is enabled, the outputs d_out<4:0>, e_out<4:0>, outn<4:0> of the successive approximation register 42 makes DACΦ 50 draw the current I(DACΦ), via the control signals S1<4:0>, S2<4:0> and S3<4:0> shown in FIG. 5, through the resistor-string. When ckc<0> is enabled, the DACΦ 50 stops drawing the current I(DACΦ). The outn<4:0> stores the inverse value of e_out<4:0>. The d_out<4:0> correspond to the inputs S1<4:0> of DACΦ 50, the e_out<4:0> correspond to the inputs S2<4:0> of DACΦ 50, and the outn<4:0> correspond to the inputs S3<4:0> of DACΦ 50.

In Reference Current Generation Mode, the embodiment tries to find a value of the reference current I(DACΦ). This reference current I(DACΦ) would render the node nx experiencing a predetermined voltage difference under operation of ckc<1> and ckc<0>. That is, $(V(nx)_{at\ ckc<0>}-V(nx)_{at\ ckc<1>})$=a predetermined voltage difference. The predetermined voltage difference may be $V_{lsb<1>}-V_{n<0>}$, $V_{lsb<0.5>}-V_{n<0>}$ or $V_{lsb<2>}-V_{n<0>}$ in FIG. 2. In a preferred embodiment, the $V_{lsb<1>}-V_{n<0>}$ is selected as the predetermined voltage difference. In other words, the present invention tries to find a value of the reference current I(DACΦ) which makes $(V(nx)_{at\ ckc<0>}-V(nx)_{at\ ckc<1>})$ approximately equal to $(V_{lsb<1>}-V_{n<0>})$, wherein $(V(nx)_{at\ ckc<0>}-V(nx)_{at\ ckc<1>})=[(\frac{1}{4}) \times I(DAC\Phi) \times 2^m \times r]$ as aforementioned. Referring to FIG. 6, r is the resistance value of each resistor, and it is assumed $I_{ful}$ is the current running through the resistor-string during the normal operation Mode. m is the number of higher bits and m=4 in our example, then $(2^m \times r \times I_{ful}) \approx$ Vrefp−Vrefn is held. From FIG. 2, Vn<1>−Vn<0>=$2^m \times [V_{lsb<1>}-V_{n<0>}]$. From FIG. 1, Vrefp−Vrefn=$2^w \times [V_{<1>}-V_{n<0>}]$. As a result, $[2^w \times (V_{lsb<1>}-V_{<0>})] \approx (2^m \times r \times I_{ful})$, w is the sum of the number of higher bits and the number of lower bits. In our example, w=m+m=4+4=8. Therefore, the desired reference current I(DACΦ) is approximately equal to $(4 \times I_{ful}/2^w)$.

In the following description, the "amplifier" stands for both operational amplifier and comparator. It is known the output signal of a typical operational amplifier will usually be accompanied with an offset voltage. The amplifier 36 is a switched capacitor amplifier the details of which is shown in FIG. 4. The input terminals (in1, in2, in3, in4) of amplifier 36 receive signals $V_{nx}$, $V_{nx}$, $V_{lsb<1>}$, $V_{n<0>}$ at nodes nx, lsb<1>, n<0> respectively. Under the control of the clock signals (ckc<1>, ckc<0>), the amplifier 36 generates a logic signal, representing the value of $(V(nx)_{at\ ckc<0>}-V(nx)_{at\ ckc<1>})-(V_{lsb<1>}-V_{n<0>})$, to successive approximation register 42. The $V(nx)_{at\ ckc<0>}$ denotes the voltage at node nx as ckc<0> is enabled, $V(nx)_{at\ ckc<1>}$ denotes the voltage at node nx as ckc<1> is enabled. The ckc<1:0> are non-overlapping clocks, and in other words, ckc<0> is disabled when ckc<1> is enabled, and vice versa. The ckc<1> is enabled first, then ckc<0> is enabled. When ckc<0> is enabled, the voltage difference between the input terminals IN, IP of amplifier 90 is [(Vin1−Vin2)−(Vin3−Vin4)+Vos], wherein Vos is the offset voltage of amplifier 90. The Vos in the [(Vin1−Vin2)−(Vin3−Vin4)+Vos] will compensate the Vos of the amplifier 90, so the output of the amplifier 90 will only be influenced by [(Vin1−Vin2)−(Vin3−Vin4)]. That is, the output of the amplifier 90 will only be influenced by $[(V(nx)_{at\ ckc<0>}-V(nx)_{at\ ckc<1>})-(V_{lsb<1>}-V_{n<0>})]$, and the output is latched in latch 80 as ckc<0> is enabled. In this way, the value of I(DACΦ), which makes $[(\frac{1}{4}) \times I(DAC\Phi) \times 2^m \times r]$ approximately equal to $(V_{lsb<1>}-V_{n<0>})$, is found through the successive approximate algorithm. To put in another way, the amplifier 90 of FIG. 4 compares $[(\frac{1}{4}) \times I(DAC\Phi) \times 2^m \times r]$ with $(V_{lsb<1>}-V_{n<0>})$, then the value of I(DACΦ) is successively found by the output value of latch 80 in cooperation with the successive approximation register 42 through the successive approximate algorithm. In the above relationship $[(\frac{1}{4}) \times I(DAC\Phi) \times 2^m \times r \approx V_{lsb<1>}-V_{n<0>}]$, the $[(\frac{1}{4}) \times I(DAC\Phi) \times 2^m \times r]$ is the voltage change experienced on node nx during switching of ckc<1> and ckc<0>.

There are three registers, d_out<4:0>, e_out<4:0>, outn<4:0>, in the successive approximation register 42. Each of the three registers has five bits, i.e. <4:0>. Outn<4:0> stores the inverse value of e_out<4:0> and correspond to the input S3<4:0> of DACΦ 50. d_out<4:0> corresponds to the input S1<4:0> of DACΦ 50, eout<4:0> corresponds to the input S2<4:0> of DACΦ 50. Referring to FIG. 5, In Reference Current Generation Mode, the output of register d_out is disabled, so the corresponding input S1<4:0> is also disabled. In the meanwhile, the register e_out<4:0> and outn<4:0> are enabled and they determine whether the current I(DACΦ) of DACΦ 50 flows into the resistor-string via node nx. The S2<4:0> values, which are also the values of e_out<4:0>, are loaded into the register d_out<4:0> as condition of [(¼)×I(DACΦ)×$2^m$×r≈$V_{lsb<1>}$−$V_{n<0>}$] is met according to the successive approximate algorithm. In FIG. 5, when S2<4:0> is ON and S3<4:0> is OFF, the current I(DACΦ) flows to Vssa via node nx. The value of I(DACΦ) is determined by S2<4:0>. For example, when S2<4:0> is 10000 (binary), I(DACΦ)=I_4lsb. When S3<4:0> is ON and S2<4:0> is OFF, the value of I(DACΦ) is zero and the current flows from Vcca to Vssa. After the value of reference current is found, the Reference Current Generation Mode is terminated, and the enable signal loads values of the register e_out into the register d_out. In the following Calibration Mode, the registers e_out and outn are disabled, the register d_out is enabled and outputs signals which are the same value as e_out. In this way, the reference current I(DACΦ) which meets condition of [(¼)× I(DACΦ)×$2^m$×r≈$V_{lsb<1>}$−$V_{n<0>}$] is used to control DACN 52, 54 or 56 via the b1 signal. The signals b2 and b3 are external bias signals keeping the corresponding MOSs in saturation mode, and both the bias signals may be generated by any well-known circuits. The signal b4 is generated by the Reference Current Generator of FIG. 6 to mirror a current.

Referring to FIG. 3, amplifier 38 and amplifier 40 define a calibration zone, or alternatively, a resolution zone. When both the output levels of amplifier 38 and 40 are high, it implies the voltage of the calibrated node, i.e. n<8>, n<12> or n<4>, should be lifted. The AND gate 60 is enabled and forces the up/down counters 44, 46 or 48 to count downwards. Then the output values of the corresponding DACN 52, 54 or 56 is lowered, the voltage of the calibrated node is lifted. When both the output levels of amplifiers 38 and 40 are low, it implies the voltage of the calibrated node should be lowered. The NOR gate 62 is enabled and forces the up/down counters 44, 46 or 48 to count upwards. Then the output values of the corresponding DACN 52, 54 or 56 are lifted, the voltage of the calibrated node is lowered. When the output level of amplifier 38 is high and the output level of amplifier 40 is low, the up/down counters 44, 46 or 48 maintains its value. The amplifier 40 in FIG. 8 and the amplifier 38 in FIG. 9 are the embodiments for implementing the above-mentioned resolution zone. The ck<3:0> clocks are non-overlapping clocks. That is, when one of the ck<3:0> is enabled, the others are disabled. The amplifier 40 in FIG. 8 is similar to the amplifier 38 in FIG. 9, and the only difference is the resolution setting value.

Figure 8:
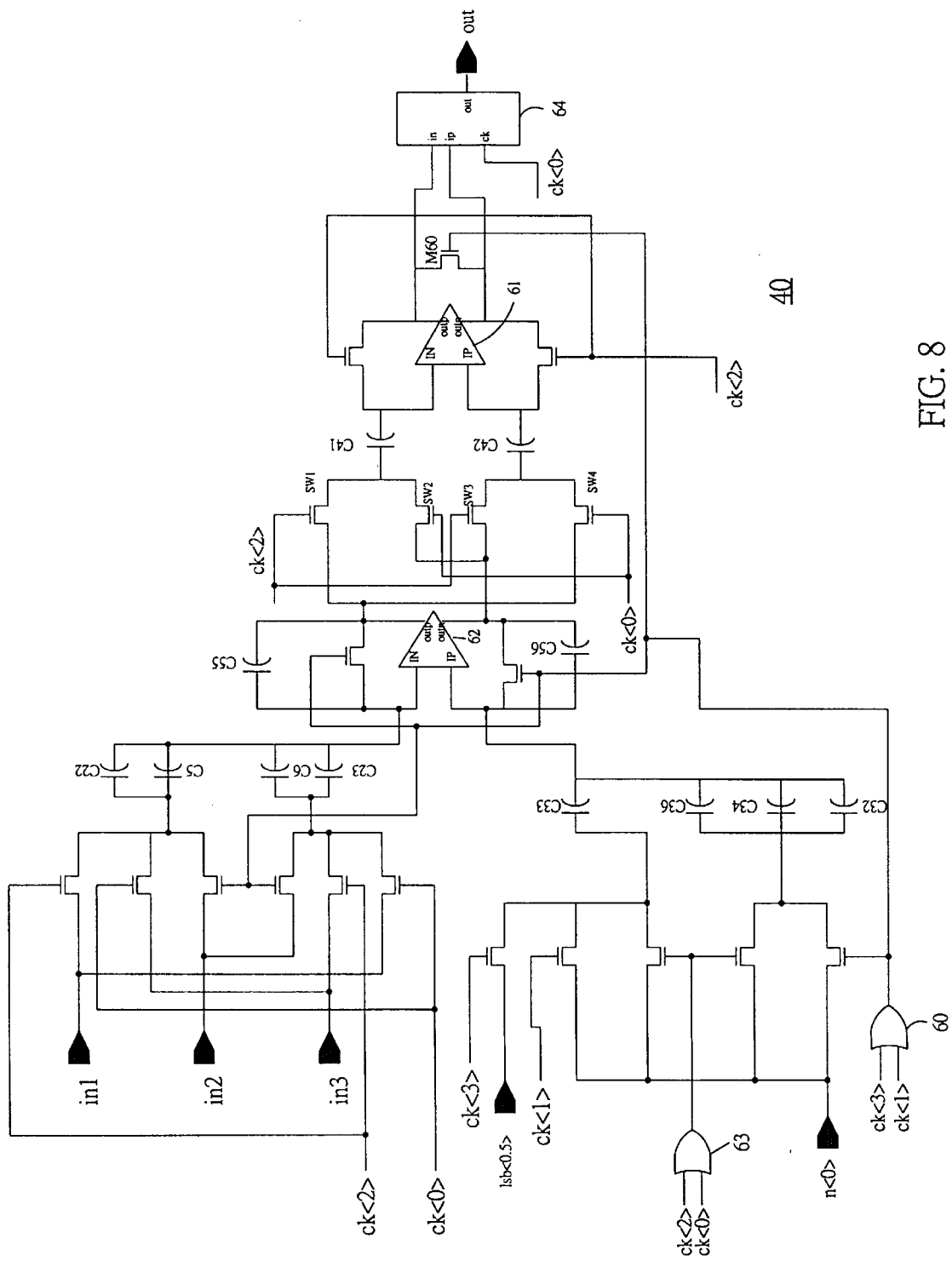
FIG. 8 discloses one embodiment of the comparator 40 in FIG. 3.
Figure 9:
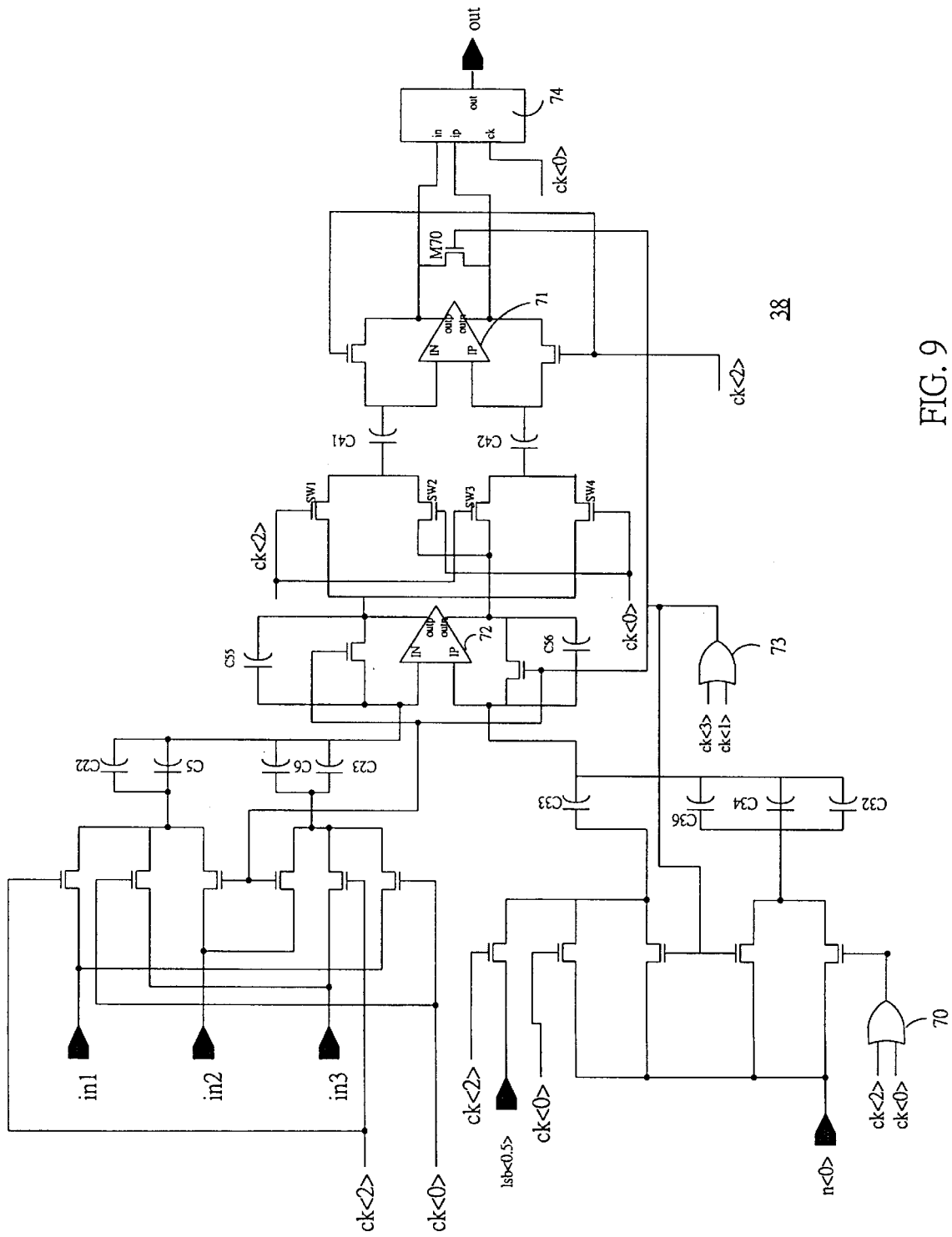
FIG. 9 discloses one embodiment of the comparator 38 in FIG. 3.

Referring to FIGS. 3 and 8, the input terminals (in1, in2, in3) of the amplifier 40 receive the outputs of the multiplexer 34. The input terminal lsb<0.5> of the amplifier 40 receives the $V_{lsb<0.5>}$ signal. The other input terminal n<0> of the amplifier 40 receives the $V_{n<0>}$ signal. These received signals are compared under the control of clock signals ck<3:0>. The output of the corresponding operational amplifier 61 in FIG. 8 indicates the difference between the summation of voltage drop of the resistor pair corresponding to the calibrated node and a predetermined resolution setting voltage. The enabling sequence of the clock signals ck<3:0> is ck<3>, ck<2>, ck<1>, then ck<0>. In other words, the values of (($V_{n<8>}$−$V_{n<4>}$)+($V_{n<0>}$−$V_{n<4>}$)) and the predetermined resolution setting voltage are compared. The values of (($V_{n<16>}$−$V_{n<12>}$)+($V_{n<8>}$−$V_{n<12>}$)) and the predetermined resolution setting voltage are compared. Or the values of (($V_{n<16>}$−$V_{n<8>}$)+($V_{n<0>}$−$V_{n<8>}$)) and the predetermined resolution setting voltage are compared. The detailed schematics of amplifier 40 is illustrated in FIG. 8. It will be clear hereinafter that value of the resolution setting voltage is (−$V_{lsb<1>}$/8) in amplifier 40.

Refer to FIGS. 3 and 9, the input terminals (in1, in2, in3) of the amplifier 38 receive the outputs of the multiplexer 34. The input terminal lsb<0.5> of the amplifier 38 receives the $V_{lsb<0.5>}$ signal. The other input terminal n<0> of the amplifier 38 receives the $V_{n<0>}$ signal. These received signals are compared under the control of clock signals ck<3:0>. The output of the corresponding operational amplifier 71 in FIG. 9 indicates the difference between the summation of voltage drop of resistor pair corresponding to the calibrated node and a predetermined resolution setting voltage. The enabling sequence of the clock signals ck<3:0> is ck<3>, ck<2>, ck<1>, then ck<0>. In other words, the values of (($V_{n<8>}$−$V_{n<4>}$)+($V_{n<0>}$−$V_{n<4>}$)) and the predetermined resolution setting voltage are compared. The values of (($V_{n<16>}$−$V_{n<12>}$)+($V_{n<8>}$−$V_{n<}$12>)) and the predetermined resolution setting voltage are compared. Or the value of (($V_{n<16>}$−$V_{n<8>}$)+($V_{n<}$0>−$V_{n<8>}$)) and the predetermined resolution voltage are compared. The detailed schematics of amplifier 38 is illustrated in FIG. 9. It will be clear hereinafter that the value of the predetermined resolution voltage is ($V_{lsb<1>}$/8) in amplifier 38.

Referring to FIG. 3 and FIG. 7, the DACN 52, 54, and 56 are controlled by the corresponding up/down counters 44, 46, and 48 respectively. The outputs of DACN 52, 54, and 56 respectively connect to the corresponding calibration nodes n<8>, n<12>, and n<4> to calibrate the voltages of the nodes. The signals b2 and b3 are external bias signals which keep the corresponding MOSs in saturation mode. Both the bias signals b2 and b3 are generated by a well-known circuit. The signal b1 is generated by the DACΦ 50 in FIG. 5 to control the currents of DACN 52, 54 or 56, and mirrors the output current $I_{ref}$ of DACΦ 50 to MOS M57. The mirror current $I_{ref}$ will generate a corresponding voltage. In response, the five voltage-controlled current sources I4, I3, I2, I1, I0 generate a corresponding mirror currents, for instance, I_4ref, I_2ref, I_1ref, I_0.5ref, and I_0.25ref. The signals sp<4:0>, sn<4:0> connect with the output terminals out<4:0>, outn<4:0> of the counters 44, 46, 48 respectively. The signals sp<4:0>, sn<4:0> switch the current path between the calibrated node, i.e. n<4>, n<12> or n<8>, and the power supply Vssa or Vcca. The out<4:0> of the up/down counters 44, 46, 48 is set to the value 10000 (binary) by the reset signal, so the DACN 52, 54, or 56 does not draw current from or source current to the calibrated node, i.e. ΔI=0. When the selection signal SEL(i) is disabled, the corresponding DACN 52, 54, or 56 does not draw current from or source current to the calibrated node. When the current is drawn from the calibrated node, the corresponding voltage is lowered. The function of the preset offset current, I_4ref, flowing through the MOS M67, M68 is to allow the circuit may either sink current ΔI from or source current ΔI to the calibrated node. The value of the ΔI is determined by the value of sp<4:0>, or, alternatively, by the value of the output terminals out<4:0> of the up/down counters 44, 46 or 48. The value of the output terminals out<4:0> is determined by the comparison result of the amplifiers 38, 40.

Referring to the amplifier 40 in FIG. 8, the latter portion of the amplifier 40 in FIG. 8 is similar to the amplifier 36 in FIG. 4. The output terminals outp and outn of the amplifier 61 connect via the switch M60 to keep the output of the amplifier 61 stable when the amplifier 61 is not activated. Therefore the comparison result will not be undesirably influenced. The enabling sequence of the clocks is ck<3>, ck<2>, ck<1>, then ck<0>. When ck<3> is enabled, the feedback switch of the operational amplifier 62 is ON and the voltages on the feedback capacitors C55, C66 are both zero. In the meanwhile the value of $V_{lsb<0.5>}$ is stored in C33, the value of $V_{n<0>}$ is stored in C32, C34 and C36, the value of Vin2 is stored in C23, C6, C5 and C22. The corresponding offset voltage of the amplifier 62 is stored in these capacitors and compensates the offset voltage of the operational amplifier 62 as ck<2> is enabled. When ck<2> is enabled, the feedback switch is OFF, and the output voltage of the operational amplifier 62 is stored in the feedback capacitors C55 and C56. In the meanwhile the output voltage of the operational amplifier 62 is sampled by the subsequent circuit and stored in the capacitors C41 and C42. When ck<2> is enabled, $V_{n<0>}$ connects with C33, C36, C34, and C32, and Vin1 connects with C5 and C22, and Vin3 connects with C6 and C23. The differential charges contributory to the output terminal are $-(Vin1-Vin2)\times(C5+C22)$, $-(Vin3-Vin2)\times(C6+C23)$ and $(V_{n<0>}-V_{lsb<0.5>})\times C33$. These charges are equally distributed onto C55 or C56. Therefore, the [V(outp)×V(outn)] of the operational amplifier 62 is $\{-(Vin1-Vin2)\times(C5+C22)-(Vin3-Vin2)\times(C6+C23)+(V_{n<0>}-V_{lsb<0.5>})\times C33\}/[(C55+C56)/2]$. If the capacitance of the above-mentioned capacitors are all the same, the [V(outp)−V(outn)] of the operational amplifier 62 at ck<2> is $[-(Vin1-Vin2+Vin3-Vin2)\times 2+(V_{n<0>}-V_{lsb<0.5>})]$. In other words, the [V(outp)−V(outn)] of the operational amplifier 62 is $4\times[(-(V_{lsb<0.5>}-V_{n<0>})/4)-(Vin1-Vin2+Vin3-Vin2)/2]$.

When ck<1> is enabled, the feedback switch of the operational amplifier 62 is ON and the voltages on the feedback capacitors C55, C66 are both zero. In the meanwhile, the value of $V_{n<0>}$ is stored in C33, C32, C34 and C36, the value of Vin2 is stored in C23, C6, C5 and C22. The corresponding offset voltage is stored in these capacitors to compensate the offset voltage of the operational amplifier 62 when ck<0> is enabled. When ck<0> is enabled, the feedback switch is OFF, and the output voltage of the operational amplifier 62 is stored in the feedback capacitors C55 and C56. In the meanwhile, the output voltage of the operational amplifier 62 is sampled by the subsequent circuit and stored in the capacitors C41 and C42. When ck<0> is enabled, $V_{n<0>}$ connects with C33, C36, C34, and C32, and Vin1 connects with C6 and C23, and Vin3 connects with C5 and C22. The differential charges contributory to the output terminal is $-(Vin1-Vin2)\times(C6+C23)-(Vin3-Vin2)\times(C5+C22)$. These charges are equally distributed onto C55 or C56. The [V(outp)−V(outn)] of the operational amplifier 62 is $\{-(Vin1-Vin2)\times(C6+C23)-(Vin3-Vin2)\times(C5+C22)\}/[(C55+C56)/2]$. If the capacitance of the above-mentioned capacitors are all the same, the [V(outp)−V(outn)] of the operational amplifier 62 at ck<0> is $[-(Vin1-Vin2+Vin3-Vin2)\times 2]$. In other words, the [V(outp)−V(outn)] of the operational amplifier 62 is $4\times[-(Vin1-Vin2+Vin3-Vin2)/2]$.

Due to the operations of ck<0>, ck<2>, switches sw1, sw2, sw3, and sw4, the output of latch 64 is related to the value of sign $\{[(V(outn)-V(outp))_{at\ ck<2>}$ of the operational amplifier 62]+[(V(outn)−V(outp))$_{at\ ck<0>}$ of the operational amplifier 62]}. When x>0, sign (x) is logic high, and when x<0, sign (x) is logic low. $\{[(V(outn)-V(outp))_{at\ ck<2>}$ of the operational amplifier 62]+[(V(outn)−V(outp))$_{at\ ck<0>}$ of the operational amplifier 62]} is equal to $\{(Vin1-Vin2)\times(C5+C22)+(Vin3-Vin2)-(C6+C23)-(V_{n<0>}-V_{lsb<0.5>})\times C33\}/[(C55+C56)/2]+\{(Vin1-Vin2)\times(C6+C23)+(Vin3-Vin2)\times(C5+C22)\}/[(C55+C56)/2]=\{(Vin1-Vin2)\times(C5+C22+C6+C23)+(Vin3-Vin2)\times(C5+C22+C6+C23)-(V_{n<0>-Vlsb<0.5>})\times C33\}/[(C55+C56)/2]$. If the capacitance of the above-mentioned capacitors are all the same, $\{[V(outn)-V(outp)]_{at\ ck<2>}$ of the operational amplifier 62}+{[V(outn)−V(outp)]$_{at\ ck<0>}$ of the operational amplifier 62} is (Vin1−Vin2+Vin3−Vin2)×4−$(V_{<0>}-V_{lsb<}0.5>)=4\times[(Vin1-Vin2+Vin3-Vin2)-(V_{n<0>}-V_{lsb<0.5>})/4]$.

Referring to FIG. 3, the nodes in1, in2, in3 of amplifiers 38, 40 connects respectively with the upper, middle, lower nodes of each resistor pair. For instance, as the calibrated node is n<4>, the upper node of the resistor pair is n<8>, the middle node of the resistor pair is n<4> and the lower node of the resistor pair is n<0>. As the calibrated node is n<12>, the upper node of the resistor pair is n<16>, the middle node of the resistor pair is n<12> and the lower node of the resistor pair is n<8>. As the calibrated node is n<8>, the upper node of the resistor pair is n<16>, the middle node of the resistor pair is n<8> and the lower node of the resistor pair is n<0>. The lsb<0.5> and n<0> of amplifiers 38, 40 connect respectively with the lsb<0.5> and n<0> labeled in FIG. 2, so the (Vin1−Vin2+Vin3−Vin2) equals to the summation of voltage difference of each resistor pair corresponding to the calibrated node. (Vn<0>−Visb<0.5>)/4 is the predetermined resolution setting value mentioned above. When Vn<0> is the reference ground, the resolution setting value is $(V_{n<0>}-V_{lsb<0.5>})/4=(-V_{lsb<0.5>}/4)=(-V_{lsb<1>}/8)$ as aforementioned.

Through the operations of the clocks ck<2> and ck<0>, the voltage differences of Vin1 and Vin3 contribute equal amount of charges to the capacitance pairs (C5, C22) and (C23, C6). In this way, possible deviation of any one of (C5, C22) and (C23, C6) from a desire capacitance value will be automatically compensated. From the $\{(Vin1-Vin2)\times(C5+C22+C6+C23)+(Vin3-Vin2)\times(C5+C22+C6+C23)-(V_{n<0>}-V_{lsb<0.5>}\times C33)\}/[(C55+C56)/2]$, it is realized that in1 and in3 connect with the same capacitance (C5+C22+C6+C23). If the capacitance of C55 and C56 are not equal, only small negligible deviation of gain will occur. The small deviation of C33 only causes the resolution setting value to shift slightly. Neither these deviations affect this calibration system.

FIG. 9 is similar to FIG. 8. In FIG. 9, the control signals of the switches connected between C32, C34, C36, C33 and input signal $V_{lsb<0.5>}$, $V_{n<0>}$ are different from those in FIG. 8 in order to have the different resolution setting value of $(+V_{lsb<1>}/8)$. The output terminals outp and outn of the amplifier 71 connect with the switch M70 to keep the output of the amplifier 71 stable when the amplifier 71 is not activated. Therefore, the comparison result will not be undesirably influenced. The enabling sequence of the clocks is ck<3>, ck<2>, ck<1>, then ck<0>. These clocks are used to control the switches connected between C32, C34, C36, C33 and input signals $V_{lsb<0.5>}$, $V_{n<0>}$. The ck<3> in FIG. 9 functions the same way as the ck<2> does in FIG. 8, the ck<1> in FIG. 9 functions the same way as the ck<0> does in FIG. 8. The sign of the received charge of C33 in FIG. 9 is thus opposite to that of FIG. 8. The resolution setting value, for example, $(V_{lsb<0.5>}-V_{n<}0>)/4$, which is opposite to that of FIG. 8, is obtained since the lsb<0.5> and n<0> connect with C32, C34, C36, C33 via non-overlapping clock signals. When $V_{n<0>}$ is the reference ground, the resolution setting value is $(V_{lsb<0.5>}-V_{n<0>})/4=(+V_{lsb<0.5>}/4)=(+V_{lsb<1>}/8)$ as aforementioned.

As aforementioned, the amplifier 38 compares the summation of voltage difference of the resistor pair with the voltage ($V_{lsb<1>}/8$), and the amplifier 40 compares the summation of voltage difference of the resistor pair with the voltage ($-V_{lsb<1>}/8$). If the summation of voltage differences of the resistor pairs is higher than this range, the amplifier 38 and amplifier 40 generate high level voltage indicating that the voltage difference of the upper resistor pair exceeds the voltage difference of the lower resistor pair by ($V_{lsb<1>}/8$). The output of AND gate 60 is enabled and the corresponding up/down counters 44, 46, or 48 counts downwards. DACN 52, 54, or 56 draw less current from the corresponding calibrated node. This action decreases the voltage difference of the upper resistor pair and increases the voltage difference of the lower resistor pair.

If the summation of voltage differences of the resistor pairs are within this range, the amplifier 38 generates low level voltage and the amplifier 40 generates high level voltage indicating the summation of voltage difference is lower than ($V_{lsb<1>}/8$) and higher than ($-V_{lsb<1>}/8$). The corresponding up/down counters 44, 46, or 48 maintain its value. DACN 52, 54 or 56 maintain their outputs.

If the summation of voltage differences of the resistor pairs is lower than this range, the amplifier 38 and amplifier 40 generate low level voltages indicating that the voltage difference of the upper resistor pair is lower than the voltage difference of the lower resistor pair by ($-V_{lsb<1>}/8$). NOR gate 62 generates logic high, and the corresponding up/down counters 44, 46, or 48 counts upwards. DACN 52, 54, or 56 draws more current from the corresponding calibrated node. This action increases the voltage difference of the upper resistor pair and decreases the voltage difference of the lower resistor pair.

In specific, the reference voltage on node n<4> is adjusted to make the voltage difference of the upper resistor pair equals to the voltage difference of the lower resistor pair, that is, $V_{n<8>}-V_{n<4>} \approx V_{n<4>}-V_{n<0>}$, or alternatively, $V_{n<8>}-V_{n<4>}+V_{n<0>}-V_{n<4>} \approx 0$. Then the voltage on node n<12> is sequentially adjusted to make the voltage difference of the upper resistor pair equals to the voltage difference of the lower resistor pair, that is, $V_{n<16>}-V_{n<12>} \approx V_{n<12>}-V_{n<8>}$. It should be noted that the current change $\Delta I$ occurs when the voltage on node n<12> is adjusted. As a result, the voltage of previously calibrated node n<4> is influenced accordingly, but the relationship $V_{n<8>}-V_{n<4>} \approx V_{n<4>}-V_{n<0>}$ is still held. Then the voltage on node n<8> is adjusted to make the voltage difference of the upper resistor pair equals to the voltage difference of the lower resistor pair, that is, $V_{n<16>}-V_{n<8>} \approx V_{n<8>}-V_{n<0>}$. It should be noted that the current change $\Delta I$ occurs when the voltage on node n<8> is adjusted. As a result, the voltage of previously calibrated node n<12> is influenced accordingly, but the relationship $V_{n<16>}-V_{n<12>} \approx V_{n<12>}-V_{n<8>}$ is still held. The adjustment sequence n<4>→n<12>→n<8>→n<4>→n<12>→n<8>→ n<4>→n<12>→n<8>→n<4>→n<12>→n<8>→n<4>→ n<12>→n<8>→n<4>→n<12>→n<8>→n<4>→n<12>→ n<8>→n<4>→n<12>→n<8>. . . goes on until $V_{n<8>}-V_{n<4>} \approx V_{n<4>}-V_{n<0>}$, $V_{n<16>}-V_{n<12>} \approx V_{n<12>}-V_{n<8>}$, and $V_{n<16>}-V_{n<8>} \approx V_{n<8>}-V_{n<0>}$ are held at the same time In this way, the precision of bit $a_3$, bit $a_2$ of a four-bit ADC is improved.

The method and apparatus of the invention have been illustrated by using above concrete example. To improve the accuracy of bit $a_1$ and bit $a_0$, a parallel induction applies.

Figure 11:
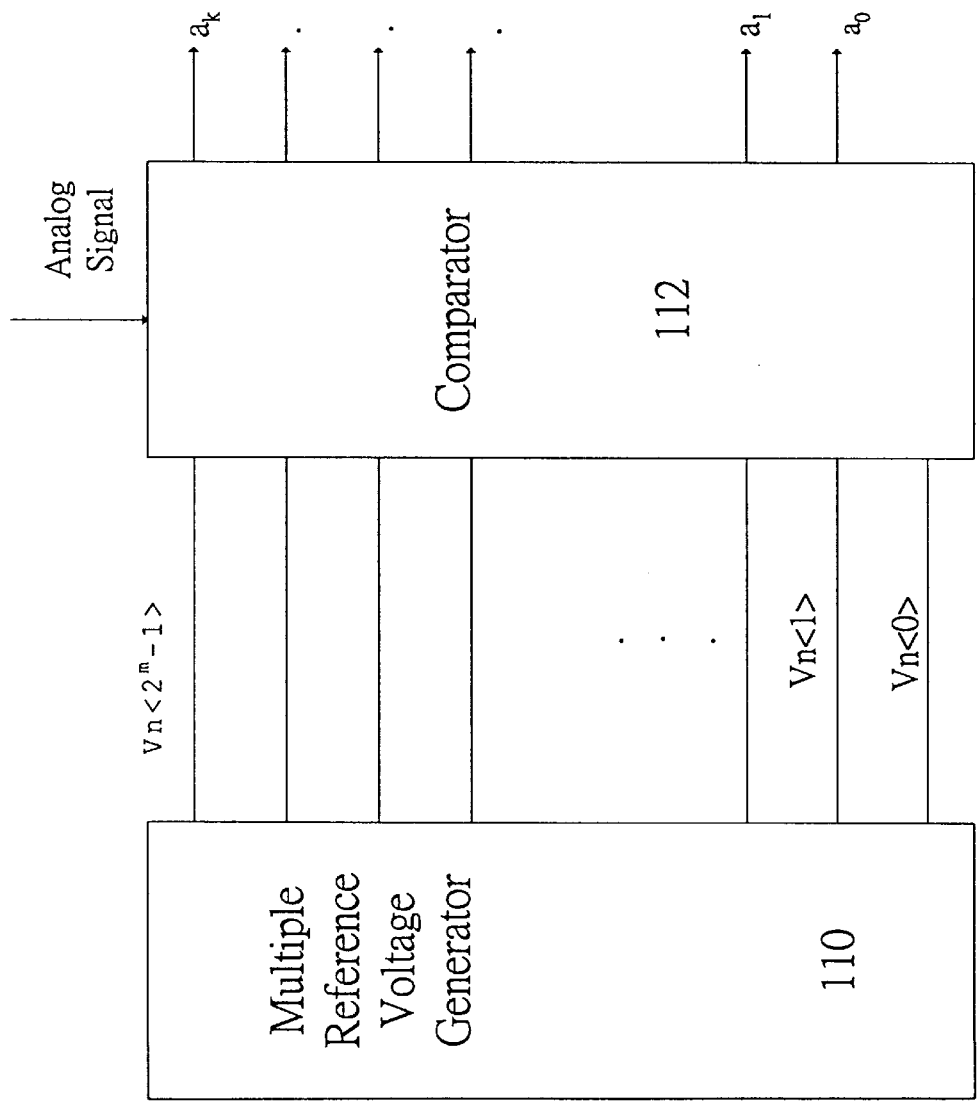
FIG. 11 discloses an analog-to-digital converter (ADC) which includes one multiple reference voltages generator of the present invention and a comparator.

An analog-to-digital converter (ADC) including the reference voltage generator of the present invention has been disclosed in FIG. 11. The analog-to-digital converter, generating multiple bits $a_k$, includes a multiple reference voltages source 110, and a comparison device 112 comparing an analog signal with the multiple reference voltages to generate the digital signals $a_k$.

Figure 12:
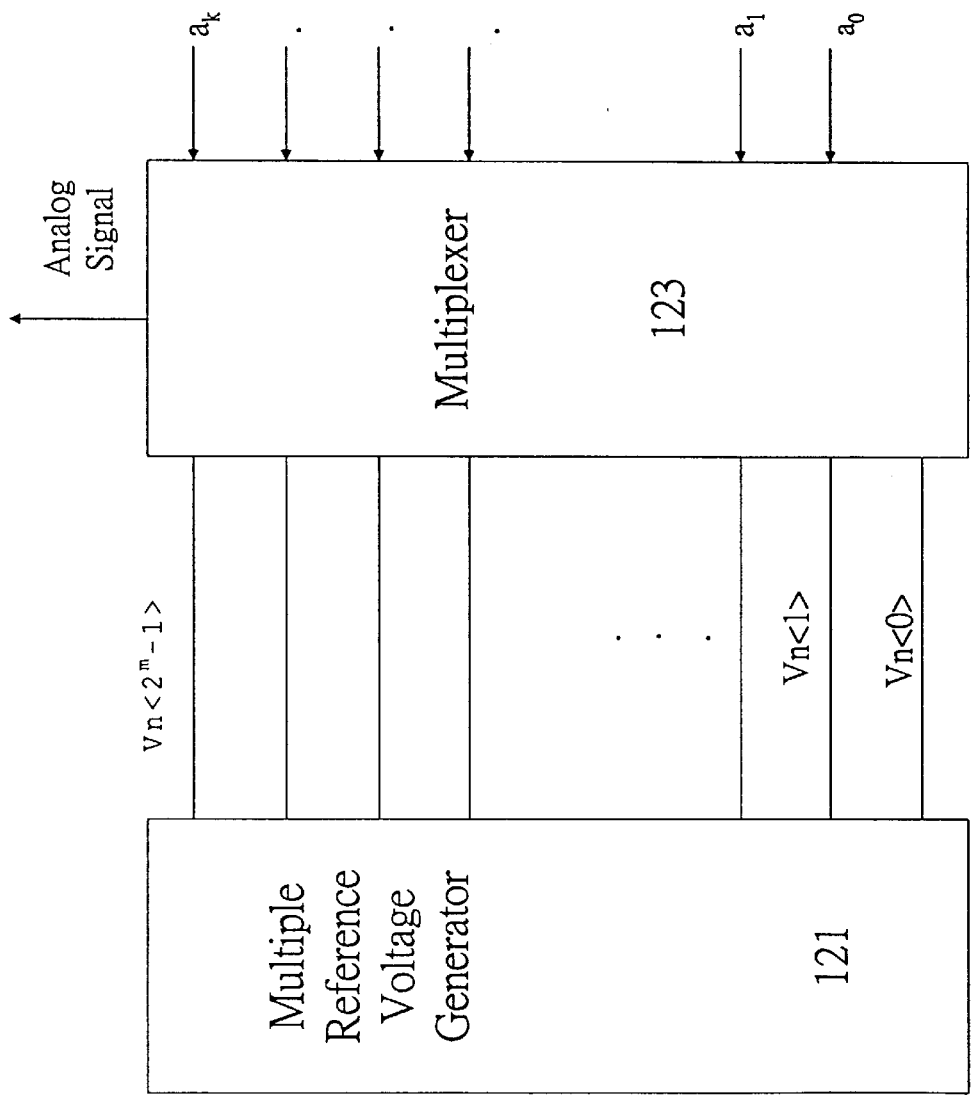
FIG. 12 discloses a digital-to-analog converter (DAC) which includes one multiple reference voltages generator of the present invention and a multiplexer.

A digital-to-analog converter (DAC) including the reference voltage generator of the present invention has been disclosed in FIG. 12. The digital-to-analog converter includes multiple reference voltage source 121 and a multiplexer device 123 receiving multiple bits $a_k$ and the multiple reference voltages to generate the analog signal.

From the conclusion of the above mentioned article "Trimless High Precision Ratioed Resistors in D/A and A/D Converters", it is known that for node votage $$Vx = \frac{\sum_{i=1}^{x} Ri}{\sum_{i=1}^{2^n} Ri} \cdot Vref = \frac{x + \sum_{i=1}^{x} \frac{tol(Ri)}{100\%}}{2^n} \cdot Vref$$

wherein $1 \leq x \leq 2^n$ and tol(Ri) is tolerance=

$$\frac{Ri - \overline{R}}{\overline{R}} \cdot 100\%.$$

Therefore, as $BDN(a_{n-1})$ is calibrated as an accurate value by the present invention, the node voltage $$Vx \cong \frac{x + \sum_{i=1}^{x} \frac{tol(Ri)}{100\%}}{2^n} \cdot Vref,$$

a=1, if $1 \leq x < 2^{n-1}$, and $a = 2^{n-1} \times 1 + 1$ if $2^{n-1} \times 1 + 1 \leq x < 2^{n-1} \times 2$. And $$Vx \cong \frac{x}{2^n} \cdot Vref$$

at $x = 2^{n-1}$ and $x = 2^n$. The error has been reduced to half by the present invention. And as $BDN(a_{n-1})$ and $BDN(a_{n-2})$ are calibrated as an accurate value by the present invention, the node voltage $$Vx \cong \frac{x + \sum_{i=1}^{x} \frac{tol(Ri)}{100\%}}{2^n} \cdot Vref,$$

a=1, if $1 \leq x < 2^{n-2}$, and $a = 2^{n-2} \times 1 + 1$ if $2^{n-2} \times 1 + 1 \leq x < 2^{n-2} \times 2$, and $a = 2^{n-2} \times 2 + 1$ if $2^{n-2} \times 2 + 1 \leq x < 2^{n-2} \times 3$ and $a = 2^{n-2} \times 3 + 1$ if $2^{n-2} \times 3 + 1 \leq x < 2^{n-2} \times 4$. And $$Vx \cong \frac{x}{2^n} \cdot Vref$$

at $x = 2^{n-1}$ and $x = 2^{n-2}$, $x = 2^{n-2} \times 3$, and $x = 2^n$. The error has been reduced to one quarter by the present invention.

What is claimed is:

1. A multiple reference voltages generation apparatus for an analog-to-digital converter (ADC) which generates m bits $a_k$, wherein k=0, 1, . . . m-1, is a positive integer, said apparatus comprising:

a resistor-string having a first terminal and a second terminal, said first terminal and said second terminal connecting respectively with a first reference voltage and a second reference voltage, said resistor-string comprising a plurality of series-connected resistors defining a plurality of nodes in which a plurality of Bit-Decision-Node $\{n<2^k \times j>$, where j is an odd positive integer and $(2^k \times j)$ is smaller than $2^m\}$ determine accuracy of a corresponding output bit $a_k$ of the ADC, a corresponding reference voltage $V_{n<2^k \times j>}$ is output at each Bit-Decision-Node;

a control means for adjusting the reference voltages $V_{n<2^k \times j>}$ to make $V_{n<2^k \times j+BW(a_k)>} - V_{n<2^k \times j>}$ approximately equal to $V_{n<2^k \times j>} - V_{n<2^k \times j-BW(a_k)>}$, wherein $BW(a_k)$ is the weight value of the bit $a_k$.

2. An apparatus according to claim 1, wherein said control means comprises a current DAC connecting with said Bit-Decision-Node $n<2^k \times j>$ for adjusting the voltage $V_{n<2^k \times j>}$.

3. An apparatus according to claim 1, wherein said control means comprises a sequence control circuit to determine the adjustment sequence of Bit-Decision-Node $n<2^k \times j>$.

4. An apparatus according to claim 1, wherein said control means comprises a successive approximate control circuit for executing a successive approximate algorithm to generate a reference current.

5. An apparatus according to claim 4, wherein said successive approximate control circuit comprises a reference current generation circuit to generate said reference current.

6. An apparatus according to claim 1, wherein said control means comprises a first amplifier and a second amplifier for determining whether $V_{n<2^k \times j+BW(a_k)>} - V_{n<2^k \times j>}$ is approximately equal to $V_{n<2^k \times j>} - V_{n<2^k \times j-BW(a_k)>}$.

7. An analog-to-digital converter (ADC) for generating m bits $a_k$, wherein $k=0, 1, \ldots m-1$, m is a positive integer, comprising:

a reference voltage source means for providing multiple reference voltages $Vn<i>$ wherein $i=0$ to $2^m-1$, said reference voltage source means comprises a resistor-string having a first terminal and a second terminal, said first terminal and said second terminal connecting respectively with a first reference voltage and a second reference voltage, said resistor-string comprises a plurality of series-connected resistors, said series-connected resistors defining a plurality of nodes in which a plurality of Bit-Decision-Node $\{n<2^k \times j>$, where j is an odd positive integer and $(2^k \times j)$ is smaller than $2^m\}$ determining accuracy of a corresponding output bit $a_k$ of the ADC, a corresponding reference voltage $V_{n<2^k \times j>}$ being output at each Bit-Decision-Node;

a control means for adjusting the voltages $V_{n<2^k \times j>}$ to make $V_{n<2^k \times j+BW(a_k)>} - V_{n<2^k \times j>}$ approximately equal to $V_{n<2^k \times j>} - V_{n<2^k \times j-BW(a_k)>}$, wherein $BW(a_k)$ is the weight value of said bit $a_k$;

a comparison means, said comparison means compares an analog signal with the multiple reference voltages $V_{n<i>}$ and generates digital signals bit $a_k$.

8. An analog-to-digital converter according to claim 7, wherein said control means first adjusts the reference voltage of a Bit-Decision-Node $n<2^k \times j>$ corresponding to a lower output bit $a_k$, and then adjusts the reference voltage of a Bit-Decision-Node $n<2^k \times j>$ corresponding to a higher output bit $a_k$.

9. An analog-to-digital converter according to claim 7, wherein said control means comprises a current DAC connecting with the Bit-Decision-Node $n<2^k \times j>$ for adjusting the reference voltage $V_{n<2^k \times j>}$.

10. An analog-to-digital converter according to claim 7, wherein said control means comprises a sequence control circuit for determine the adjustment sequence of the Bit-Decision-Node $n<2^k \times j>$.

11. An analog-to-digital converter according to claim 7, wherein said control means comprises a successive approximate control circuit for executing a successive approximate algorithm to generate a reference current.

12. An analog-to-digital converter according to claim 11, wherein said successive approximate control circuit comprises a reference current generation circuit to generate said reference current.

13. An analog-to-digital converter according to claim 7, wherein said control means comprises a first amplifier and a second amplifier for determining whether $V_{n<2^k \times j+BW(a_k)>} - V_{n<2^k \times j>}$ is approximately equal to $V_{n<2^k \times j>} - V_{n<2^k \times j-BW(a_k)>}$.

14. An apparatus for providing multiple reference voltages $Vn<i>$ to a digital-to-analog converter (DAC), said digital-to-analog converter receiving m bits $a_k$ and generating an analog signal, wherein $k=0, 1, \ldots m-1$, m is a positive integer, $i=0$ to $2^m-1$, comprising:

a resistor-string having a first terminal and a second terminal, said first terminal and said second terminal connecting respectively with a first reference voltage and a second reference voltage, said resistor-string comprises a plurality of series-connected resistors, said series-connected resistors defining a plurality of nodes in which a plurality of Bit-Decision-Node $\{n<2^k \times j>$, where j is an odd positive integer and $(2^k \times j)$ is smaller than $2^m\}$ are defined to a corresponding bit $a_k$ of the DAC, a corresponding reference voltage $V_{n<2^k \times j>}$ is output at each Bit-Decision-Node;

a control means for adjusting the reference voltages $V_{n<2^k \times j>}$ to make $V_{n<2^k \times j+BW(a_k)>} - V_{n<2^k \times j>}$ approximately equal to $V_{n<2^k \times j>} - V_{n<2^k \times j-BW(a_k)>}$, wherein $BW(a_k)$ is the weight value of said bit $a_k$.

15. An apparatus according to claim 14, wherein said control means comprises a current DAC connecting with the Bit-Decision-Node $n<2^k \times j>$ for adjusting the reference voltage $V_{n<2^k \times j>}$.

16. An apparatus according to claim 14, wherein said control means comprises a sequence control circuit for determining the adjustment sequence of the Bit-Decision-Node $n<2^k \times j>$.

17. An apparatus according to claim 14, wherein said control means comprises a successive approximate control circuit for executing a successive approximate algorithm to generate a reference current.

18. An apparatus according to claim 17, wherein said successive approximate control circuit comprises a reference current generation circuit to generate said reference current.

19. An apparatus according to claim 14, wherein said control means comprises a first amplifier and a second amplifier for determining whether $V_{n<2^k \times j+BW(a_k)>} - V_{n<2^k \times j>}$ is approximately equal to $V_{n<2^k \times j>} - V_{n<2^k \times j-BW(a_k)>}$.

20. A digital-to-analog converter (DAC) which receives m bits $a_k$, wherein $k=0, 1, \ldots m-1$, m is a positive integer and generates an analog signal, comprising:

a reference voltage source means providing a plurality of reference voltages $V_{n<i>}$, wherein $i=0$ to $2^m-1$, said reference voltage source means comprising a resistor-string having a first terminal and a second terminal, said first terminal and said second terminal connecting respectively with a first reference voltage and a second reference voltage, said resistor-string comprises a plurality of series-connected resistors, said series-connected resistors defining a plurality of nodes in which a plurality of Bit-Decision-Node $\{n<2^k \times j>$, where j is an odd positive integer and ($2^k \times j$) is smaller than $2^m$} are defined to a corresponding bit $a_k$ of the DAC, a corresponding reference voltage $V_{n<2^k \times j>}$ is output at each Bit-Decision-Node;

a control means for adjusting the reference voltage $V_{n<2^k \times j>}$ to make $V_{n<2^k \times j + BW(a_k)>} - V_{n<2^k \times j>}$ approximately equal to $V_{n<2^k \times j>} - V_{n<2^k \times j - BW(a_k)>}$, wherein $BW(a_k)$ is the weight value of said bit $a_k$;

a multiplexer means, responsive to the multiple bits $a_k$ and the multiple reference voltages $V_{n<i>}$, for generating said analog signal.

21. A digital-to-analog converter according to claim 20, wherein said control means first adjusts the reference voltage of a Bit-Decision-Node $n<2^k \times j>$ corresponding to a lower bit $a_k$, and then adjusts the reference voltage of a Bit-Decision-Node $n<2^k \times j>$ corresponding to a higher bit $a_k$.

22. A digital-to-analog converter according to claim 20, wherein said control means comprises a current DAC connecting with the Bit-Decision node $n<2^k \times j>$ for adjusting the voltage $V_{n<2^k \times j>}$.

23. A digital-to-analog converter according to claim 20, wherein said control means comprises a sequence control circuit for determining the adjustment sequence of the Bit-Decision node $n<2^k \times j>$.

24. A digital-to-analog converter according to claim 20, wherein said control means comprises a successive approximate control circuit for executing a successive approximate algorithm to generate a reference current.

25. A digital-to-analog converter according to claim 24, wherein said successive approximate control circuit comprises a reference current generation circuit to generate said reference current.

26. An apparatus according to claim 20, wherein said control means comprises a first amplifier and a second amplifier for determining whether $V_{n<2^k \times j + BW(a_k)>} - V_{n<2^k \times j>}$ is approximately equal to $V_{n<2^k \times j>-Vn<2^k \times j - BW(a_k)>}$.

* * * * *